(12) United States Patent
Peng et al.

(10) Patent No.: US 11,757,419 B2
(45) Date of Patent: Sep. 12, 2023

(54) RADIO FREQUENCY POWER AMPLIFIER CIRCUIT AND GAIN CONTROL METHOD

(71) Applicant: SMARTER MICROELECTRONICS (GUANG ZHOU) CO., LTD., Guangzhou (CN)

(72) Inventors: Zhenfei Peng, Guangzhou (CN); Qiang Su, Guangzhou (CN); Kun Xiang, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 507 days.

(21) Appl. No.: 17/136,014

(22) Filed: Dec. 29, 2020

(65) Prior Publication Data

US 2021/0265965 A1 Aug. 26, 2021

Related U.S. Application Data

(63) Continuation of application No. PCT/CN2020/115426, filed on Sep. 15, 2020.

(30) Foreign Application Priority Data

Feb. 25, 2020 (CN) .......................... 202010116336.X

(51) Int. Cl.
*H03F 3/191* (2006.01)
*H03G 3/30* (2006.01)
(Continued)

(52) U.S. Cl.
CPC ........... *H03G 3/3042* (2013.01); *G16Y 10/75* (2020.01); *H03F 1/56* (2013.01); *H03F 3/245* (2013.01);
(Continued)

(58) Field of Classification Search
CPC ................................. H03F 3/191; H03F 1/22
(Continued)

(56) References Cited

U.S. PATENT DOCUMENTS 5,373,251 A * 12/1994 Kunitomo ............ H03G 3/3042
330/285
6,249,186 B1 * 6/2001 Ebihara ................... H01L 23/66
330/277
(Continued)

*Primary Examiner* — Henry Choe
(74) *Attorney, Agent, or Firm* — SYNCODA LLC; Feng Ma

(57) ABSTRACT

A radio frequency power amplifier circuit includes a controllable attenuation circuit, an input matching circuit, a drive amplification circuit, an inter-stage matching circuit, a power amplification circuit and an output matching circuit connected in sequence, and respectively configured to switch between a negative gain mode and a non-negative gain mode of the radio frequency power amplifier circuit based on a mode control signal, match the impedance between the controllable attenuation circuit and the drive amplification circuit, amplify a signal, configured to match the impedance between the drive amplification circuit and the power amplification circuit, amplify a signal, and match the impedance between the radio frequency power amplifier circuit and a post-stage circuit. A feedback circuit is connected across the drive amplification circuit, and is configured to adjust a gain.

19 Claims, 5 Drawing Sheets

(51) Int. Cl.
    *H03F 3/24*         (2006.01)
    *H03F 1/56*         (2006.01)
    *G16Y 10/75*        (2020.01)
    *H04B 1/40*         (2015.01)

(52) U.S. Cl.
    CPC ......... H04B 1/40 (2013.01); *H03F 2200/222* (2013.01); *H03F 2200/387* (2013.01); *H03F 2200/451* (2013.01); *H03G 2201/103* (2013.01); *H03G 2201/307* (2013.01)

(58) Field of Classification Search
    USPC .......................................... 330/302, 305, 311
    See application file for complete search history.

(56) References Cited

U.S. PATENT DOCUMENTS

| | | | | |
|---|---|---|---|---|
| 6,967,528 | B2 * | 11/2005 | Takagi | H03F 1/342 |
| | | | | 330/285 |
| 7,202,736 | B1 * | 4/2007 | Dow | H03F 1/30 |
| | | | | 330/129 |
| 8,264,282 | B1 * | 9/2012 | Riekki | H03F 1/301 |
| | | | | 330/9 |
| 8,354,888 | B2 * | 1/2013 | Matsuzuka | H03F 3/60 |
| | | | | 330/296 |
| 8,536,950 | B2 * | 9/2013 | Nejati | H03F 3/72 |
| | | | | 330/51 |

\* cited by examiner

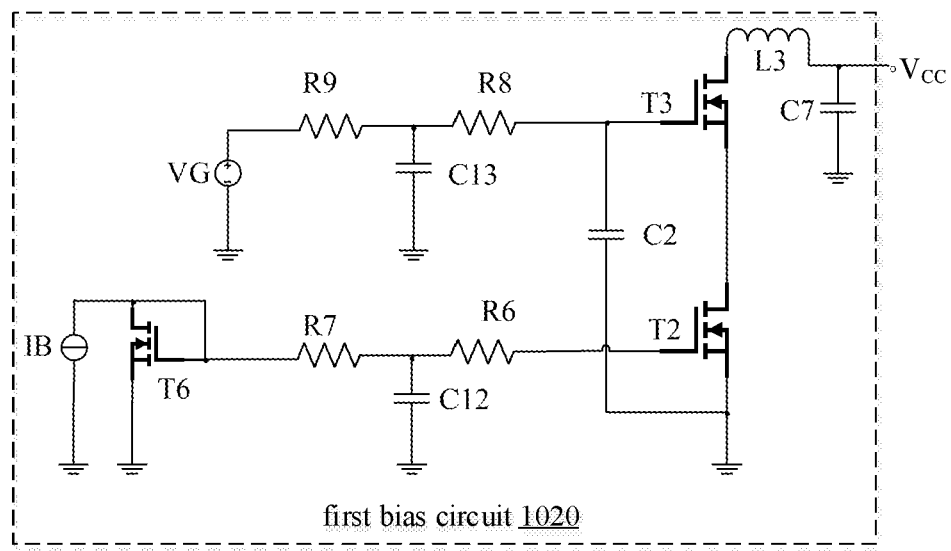
FIG. 7
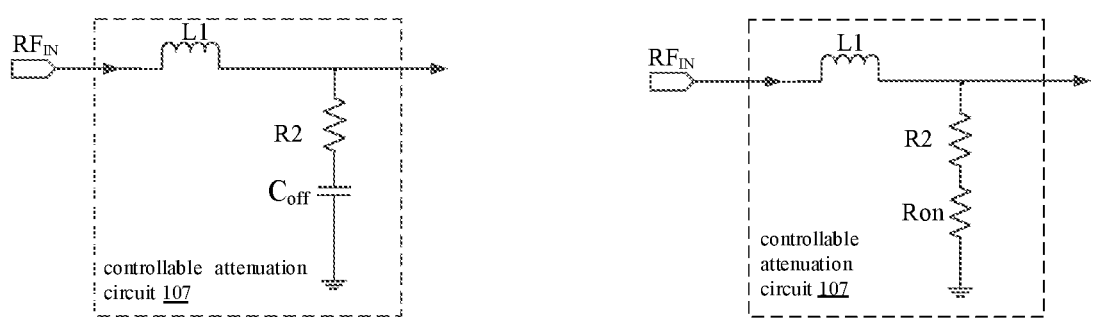
FIG. 8A
FIG. 8B

RADIO FREQUENCY POWER AMPLIFIER CIRCUIT AND GAIN CONTROL METHOD

CROSS-REFERENCE TO RELATED APPLICATIONS

This application is a continuation of International Application No. PCT/CN2020/115426 filed on Sep. 15, 2020, which claims priority to Chinese Patent Application No. 202010116336.X filed on Feb. 25, 2020. The disclosures of these applications are hereby incorporated by reference in their entirety.

BACKGROUND

A Power Amplifier (PA) in a radio frequency front-end system generally requires adjustable transmission power, and when an output dynamic range of a radio frequency transceiver in front of the PA is limited, a gain of the power amplifier is required to be adjustable. In the application scenario of wide-area and low-power consumption communication, the requirement for adjustable gain of the radio frequency power amplifier circuit becomes more prominent, and its dynamic range may reach 35 to 40 dB. Negative gains may also be needed in some scenarios.

SUMMARY

Various embodiments of the present disclosure provide a radio frequency power amplifier circuit and a gain control method.

Some embodiments of the disclosure provide a radio frequency power amplifier circuit applied to a terminal, including:

a controllable attenuation circuit, an input matching circuit, a drive amplification circuit, an inter-stage matching circuit, a power amplification circuit and an output matching circuit connected in sequence, and a feedback circuit connected across the drive amplification circuit;

the controllable attenuation circuit configured to switch between a negative gain mode and a non-negative gain mode of the radio frequency power amplifier circuit based on a mode control signal transmitted by a microprocessor of the terminal;

the input matching circuit configured to match the impedance between the controllable attenuation circuit and the drive amplification circuit;

the drive amplification circuit configured to amplify a signal output from the input matching circuit;

the feedback circuit configured to adjust a gain of the radio frequency power amplifier circuit;

the inter-stage matching circuit configured to match the impedance between the drive amplification circuit and the power amplification circuit;

the power amplification circuit configured to amplify a signal output from the inter-stage matching circuit; and the output matching circuit configured to match the impedance between the radio frequency power amplifier circuit and a post-stage circuit.

The embodiments of the disclosure provide a gain control method applied to the radio frequency power amplifier circuit described above, the method including:

determining, by a microcontroller of the terminal, an operating mode of the radio frequency power amplifier circuit, after receiving a control information via a communication module, and controlling, by the microcontroller of the terminal, the radio frequency power amplifier circuit to enter the operating mode by transmitting a mode control signal.

switching, by the controllable attenuation circuit, between the negative gain mode and the non-negative gain mode of the radio frequency power amplifier circuit, based on a mode control signal transmitted by the microprocessor of the terminal;

matching, by the input matching circuit, the impedance between the controllable attenuation circuit and the drive amplification circuit;

amplifying, by the drive amplification circuit, the signal output from the input matching circuit;

adjusting, by the feedback circuit, the gain of the radio frequency power amplifier circuit;

matching, by the inter-stage matching circuit, the impedance between the drive amplification circuit and the power amplification circuit;

amplifying, by the power amplification circuit, the signal output from the inter-stage matching circuit; and matching, by the output matching circuit, the impedance between the radio frequency power amplifier circuit and the post-stage circuit.

In the embodiments of the disclosure, the input signal is processed by circuits such as the controllable attenuation circuit, the feedback circuit, the drive amplification circuit, the power amplification circuit etc. of the radio frequency power amplifier circuit to realize the switching between the negative gain mode and the non-negative gain mode of the radio frequency power amplifier circuit, the structure of the circuit is simple, which may effectively reduce the hardware cost thereof.

It should be understood that the above general descriptions and the following detailed descriptions are merely illustrative and interpretive, and are not intended to limit the embodiments of the disclosure.

Other features and aspects of the disclosure will become clear in light of the detailed description of the exemplary embodiments described below with reference to the appended figures.

BRIEF DESCRIPTION OF THE DRAWINGS

The drawings, which are incorporated into the disclosure and form a part of the disclosure, illustrate the embodiments conforming to the disclosure and explain some technical solutions of the disclosure together with the specification.

FIG. 7 is a schematic diagram of a first bias circuit provided by an embodiment of the disclosure;

FIG. 8A is an equivalent schematic diagram of a controllable attenuation circuit with a first switch turned off, provided by an embodiment of the disclosure;

FIG. 8B is an equivalent schematic diagram of a controllable attenuation circuit with a first switch turned on, provided by an embodiment of the disclosure;

DETAILED DESCRIPTION

A gain may be usually adjusted through a negative feedback provided by a feedback circuit, but the feedback circuit only increases or decreases the gain, but cannot realize a negative gain, and cannot meet the requirements of the negative gain of the radio frequency power amplifier circuit.

For a Narrow Band Internet of Things (NB-IoT) terminal (User Equipment, abbreviated as UE), a radio frequency power amplifier circuit of a radio frequency front-end system generally requires adjustable transmission power, and when an output dynamic range of a radio frequency transceiver in front of the radio frequency power amplifier circuit is limited, a gain of the power amplifier is required to be adjustable. In the application scenario of wide-area and low-power consumption communication, the requirement for adjustable gain of the radio frequency power amplifier circuit becomes more prominent, and its dynamic range shall reach up to 35 to 40 dB, and a mode for requiring a negative gain occurs. For example, a requirement of the negative gain occurs in the case that NB-IoT communication objects are close to each other (NB-IoT terminals are very close to the base station).

During the application, on the one hand, in the design of the radio frequency power amplifier circuit, the power gain may be reduced, a negative feedback of a drive stage transistor is enhanced without excessively affecting the original circuit matching; on the other hand, the design of the controllable attenuation circuit may be inserted in the input matching circuit, which has less impact on the performance of the power amplifier and reduces the gain significantly.

Figure 1A:
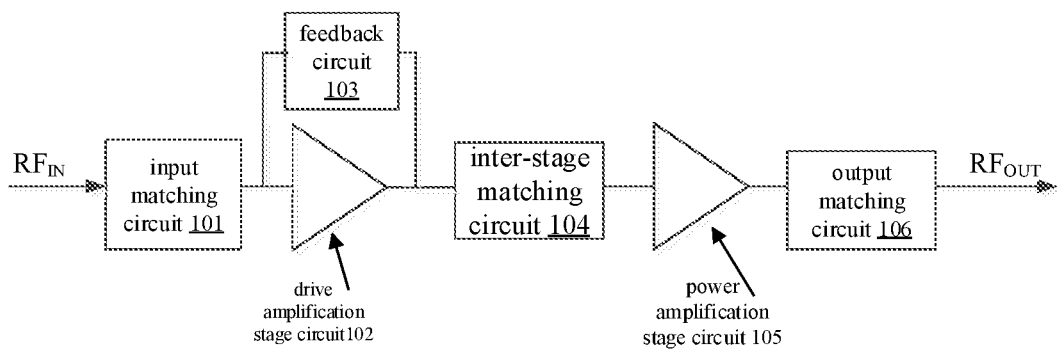
FIG. 1A is a schematic diagram of the composition of a radio frequency power amplifier circuit provided by an embodiment of the disclosure.
Figure 1B:
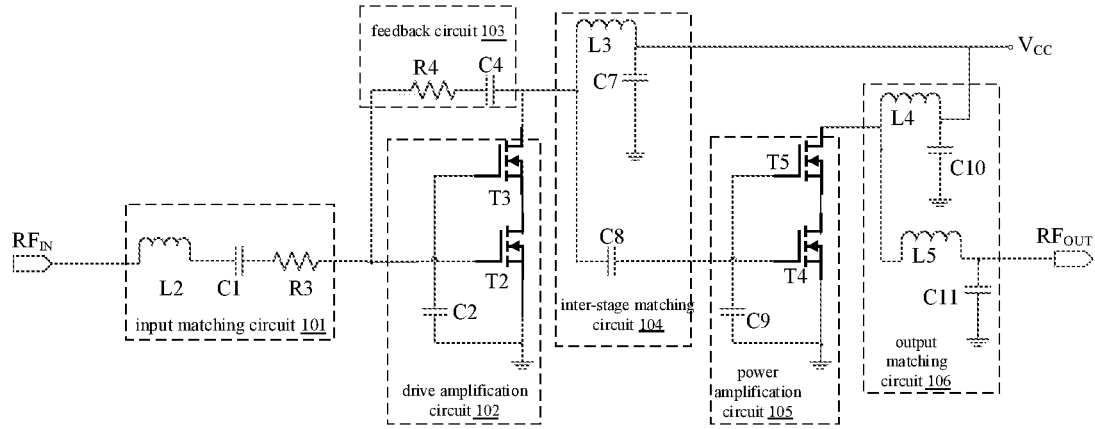
FIG. 1B is a schematic diagram of the circuit structure of a radio frequency power amplifier circuit provided by an embodiment of the disclosure.

The following describes a radio frequency power amplifier circuit, which generally reduces the gain by enhancing the negative feedback of the drive stage, based on a circuit with a high gain mode. FIG. 1A is a schematic diagram of the composition of the radio frequency power amplifier circuit in some embodiments, and FIG. 1B is a schematic diagram of the structure of the circuit of FIG. 1A. With reference to FIG. 1A and FIG. 1B, the design for reducing gain in the first solution generally includes an input matching circuit 101, a drive amplification stage circuit 102, a feedback circuit 103, an inter-stage matching circuit 104, a power amplification stage circuit 105 and an output matching circuit 106.

Herein, the input matching circuit 101 includes L2, C1 and R3 connected in series; and the drive amplification stage circuit 102 forms a cascode structure by superimposing Metal-Oxide-Semiconductor Field-Effect Transistors (MOSFETs) T2 and T3, and a gate of T3 is radio frequency grounded through C2; and the feedback circuit 103 includes R4 and C4 connected in series and is connected across a gate of T2 and a drain of T3; and the inter-stage matching circuit 104 includes L3, C7 and C8; and the power amplification stage circuit 105 form a cascode structure by superimposing MOSFETs T4 and T5, and a gate of T5 is radio frequency grounded through C6. The output matching circuit 106 includes L4, L5, C10 and C11. Here, T2 and T4 form a current bias circuit (in the form of a current mirror), and T3 and T5 form a voltage bias circuit, which is omitted in FIG. 1B. The first solution may better guarantee the performance of the power amplifier in terms of the bandwidth and linearity etc. after the gain reduction, however, the negative feedback provided by the feedback circuit may reduce the gain only but cannot turn it to be negative.

The technical solutions according to some embodiments of the disclosure are further described in detail below in conjunction with the figures and embodiments.

In the application scenario of NB-IoT, terminals, such as water and electricity meters, etc. have a radio frequency transceiver, a communication module, a microcontroller, a radio frequency power amplifier circuit and an antenna etc. within them.

The radio frequency transceiver is configured to mix signals; the communication module is configured to communicate with a base station to realize automatic meter reading; the microcontroller is configured to control the radio frequency power amplifier circuit to get a certain output power; the radio frequency power amplifier circuit is configured to amplify or attenuate the output signal of the radio frequency transceiver base on the control of the microcontroller; the antenna is configured to emit the output signal of the radio frequency power amplifier circuit.

Due to the wide distribution of the terminals (such as water and electricity meters), the distance of each of the terminals from the base station varies, and terminals far from the base station have a large channel attenuation, thus requiring a large output power of the radio frequency power amplifier circuit; while terminals close to the base station have a small channel attenuation, thus requiring a small output power of the radio frequency power amplifier circuit. The microcontroller controls the input power and gain of the radio frequency power amplifier circuit to control the output power of the radio frequency power amplifier circuit, so that the output power may meet the requirements.

For example, the base station transmits a Synchronization Channel (SCH) and a Broadcast Channel (BCH) by using predetermined communication resources. Then, the terminal first captures the SCH to ensure synchronization with the base station. Then, the terminal acquires the parameters (e.g., frequency, bandwidth, etc.) specific to the base station by reading the BCH. After acquiring the parameters specific to the base station, the terminal establishes communication with the base station by making a connection request to the base station. The base station transmits control information to the terminals that have established communication through control channels such as Physical Downlink Control Channel (PDCCH) etc. as needed. The microcontroller of the terminal controls the output power after receiving the control information through the communication module, so that the output power may meet the requirements.

During the communication between the base station and the terminal, the Link Budget (LB) (in decibels) is determined based on Path Loss (PL), and then the transmitting power (PT) (in decibel relative to one watt (dBw), or in decibel relative to one milliwatt (dBm)) of the terminal is determined based on the Link Budget LB. After the terminal communicates with the base station, the transmitting power PT of the antenna is determined, the output power of the radio frequency power amplifier circuit is determined based on the transmit power PT of the antenna and the gain of the antenna, the input power and the gain of the radio frequency power amplifier circuit is determined based on the output power of the radio frequency power amplifier circuit, the input power of the radio frequency power amplifier circuit is adjusted by the microcontroller, and the mode control signal of the radio frequency power amplifier circuit is determined based on the gain, so that the final output power thereof may meet the requirements.

Herein, the path loss PL is calculated from equation (1):

$$PL = 20 \log 10(f) + 20 \log 10(d) - c \qquad (1);$$

herein, f is the signal frequency in megahertz (MHz); d is the distance between the base station and the terminal, in meters, and c is the empirical value, which is generally taken as 28.

In some embodiments, when the path loss PL is calculated for a distance of d=1200 m with frequencies of f=915 MHz and f=2.4 GHz respectively, in an outdoor open environment, one can derive the PL for f=915 MHz according to equation (1) as 20 log 10(915)+20 log 10(1200)−28=92.8 dB, and one can also derive the PL for f=2.4 GHz as: 20 log 10(2400)+20 log 10(1200)−28=101.2 dB.

When the path loss PL between the transmitter and the target receiver is greater than the link budget LB, then data loss will occur and communication will be impossible, so the link budget LB shall be greater than or equal to the path loss PL, from which the value of the link budget may be obtained. The transmitting power PT of the terminal is calculated from equation (2):

$$LB = PT + GT + GR - RS \qquad (2);$$

herein, GT is the gain of the antenna of the terminal, in decibels (dB); and GR is the gain of the antenna of the receiver of the base station, in decibels (dB); RS is the sensitivity of the receiver, which is the minimum radio frequency signal that the system may detect in the case of an acceptable Signal to Noise Ratio (SNR). RS may be calculated from equation (3):

$$RS = -174 \text{ dBm/Hz} + NF + 10 \log B + SNR\text{MIN} \qquad (3);$$

herein, −174 dBm/Hz is the thermal noise threshold; NF is the total receiver noise of the receiver, in decibels (dB); B is the overall bandwidth of the receiver, in hertz (Hz), and SNRMIN is the minimum signal to noise ratio.

In general, three modes exist for the radio frequency power amplifier circuit: a high-power mode (a non-negative gain), a medium power mode (a non-negative gain) and a low power mode (a negative gain). Since the output range of the linear power of the radio frequency transceiver is from −35 dBm to 0 dBm, the signal will be non-linear when it goes outside this range.

When the radio frequency power amplifier circuit operates in the high power mode, the saturation power of the radio frequency power amplifier circuit is required to be 27.5 dBm, at this time the signal will be non-linear and its power needs to be less than 22.5 dBm so as to realize a linear output, at this time the linear gain of the radio frequency power amplifier circuit is 30 dB, so the range of its linear output power is from −5 dBm to 22.5 dBm.

When the radio frequency power amplifier circuit operates in the medium power mode, the saturation power of the radio frequency power amplifier circuit is required to be 20 dBm, at this time the signal will be non-linear and its power needs to be less than 10 dBm to realize a linear output, at this time the linear gain of the radio frequency power amplifier circuit is 15 dB, so the range of its linear output power is from −20 dBm to 10 dBm.

When the radio frequency power amplifier circuit operates in the low power mode (the negative gain), the saturation power of the radio frequency power amplifier circuit is required to be 5 dBm, at this time the signal will be non-linear and its power needs to be less than −10 dBm to realize a linear output, at this time the linear gain of the radio frequency power amplifier circuit is −10 dB, so the range of its linear output power is from −45 dBm to −10 dBm.

There is an overlap of power levels in the above high, medium and low power modes, which is a requirement for the platform of the NB-IoT technology, so as to ensure the flexibility of the configuration of the application side. For example, the power mode with low power consumption is selected at the same power level. Therefore, the power of the transmitting signal, i.e. the output power, covers from −45 dBm to 22.5 dBm, an output range of total 67.5 dB linear power, which may meet the requirements of a signal coverage of wide-area.

Referring to FIGS. 1A and 1B, the gain may be further reduced by adjusting the bias circuit of transistors at all stages (e.g., adjusting the bias currents of the drains of T2 and T4, or adjusting the bias voltages of the drains of T3 and T5) and introducing a controllable attenuation circuit in front of the input matching circuit, based on the enhancement of the negative feedback of the radio frequency power amplifier circuit (by introducing the negative feedback circuit). In theory, the controllable attenuation circuit may be designed to meet the requirements of negative gain. Here, what needs to be considered by the controllable attenuation circuit is to minimize its impact on the input matching circuit of the amplifier, and preferably to be integrated with the design of the input matching circuit. In addition, the radio frequency power amplifier circuit is required to have an appropriate capacity of radio frequency conduction power and a capability of Electro-Static Discharge (ESD) when being not in the operating mode of negative gain.

Figure 2A:
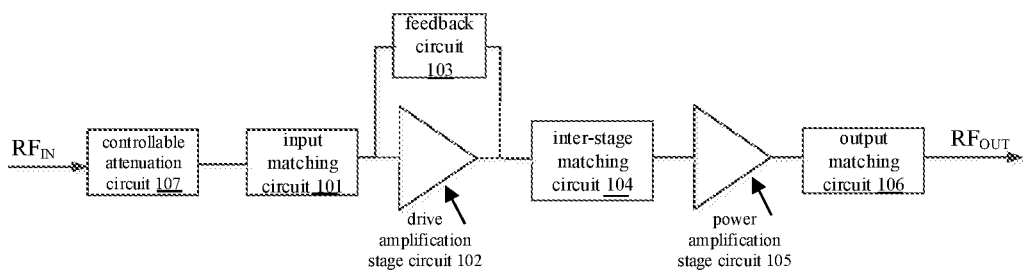
FIG. 2A is a schematic diagram of the composition of a radio frequency power amplifier circuit provided by some embodiments of the disclosure.
Figure 2B:
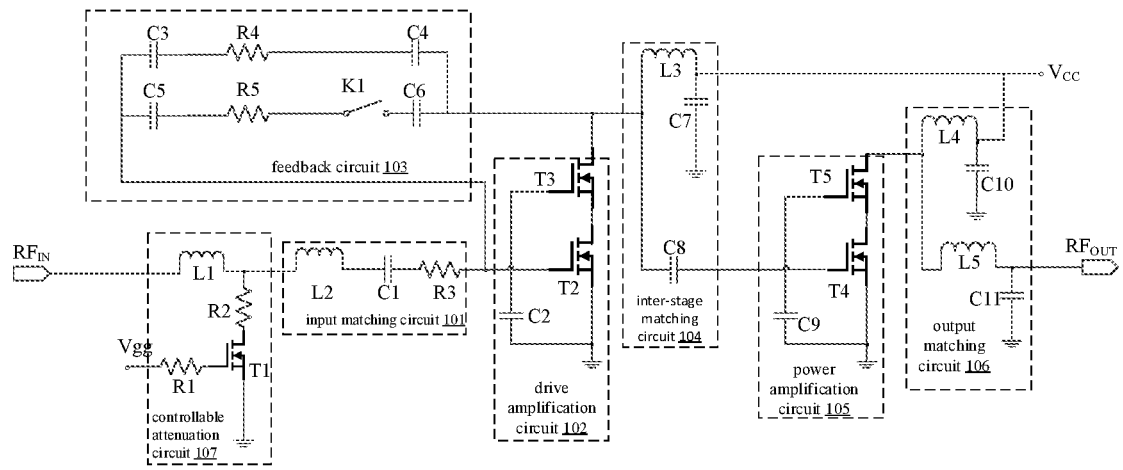
FIG. 2B is a schematic diagram of the circuit structure of a radio frequency power amplifier circuit provided by some embodiments of the disclosure.

Some embodiments of the disclosure provide a radio frequency power amplifier circuit, as illustrated in FIGS. 2A and 2B, it has a controllable attenuation circuit inserted between the input port and the input matching circuit, as compared to FIG. 1A.

When the radio frequency power amplifier circuit is in the non-negative gain mode, the controllable attenuation circuit is in the non-attenuation state, and it needs to reduce the impact on radio frequency power conduction and requires isolation of the input matching circuit from the controllable attenuation circuit during the application.

When the radio frequency power amplifier circuit is in the negative gain mode, the controllable attenuation circuit is in the attenuation state, and a part of radio frequency conduction energies enters the controllable attenuation circuit to become thermal energy to be consumed, and the other part of the radio frequency conduction energies enters the power amplifier to be amplified (on the basis of the circuit with enhanced negative feedback, amplifying the attenuated radio frequency signal).

When the controllable attenuation circuit of the embodiments of the disclosure is in the attenuation state, the attenuation of the entire circuit may be up to about −10 dB. It may be understood that the input signal entering the circuit from the RFIN end has been attenuated by 10 dB. In terms of the gain characteristics of the entire circuit, the gain of the power amplifier is −10 dB now when the gain of the original amplifier with enhanced negative feedback is 0 dB.

The negative gain of the entire circuit includes three parts: (1) the bias circuit of the MOSFET is switched to the reduced voltage and the reduced current; (2) the feedback circuit of the drive stage of the radio frequency power amplifier circuit is switched to feedback enhancement; (3) the grounding switch of the controllable attenuation circuit of the input matching is turned off. Herein, when (1) and (2) are satisfied at the same time, the gain of the entire circuit realizes a minimum of about 0 dB from the point of design. And then by adding (3), the circuit may be further attenuated by about 10 dB. That is, the negative gain amplification is satisfied.

Figure 3:
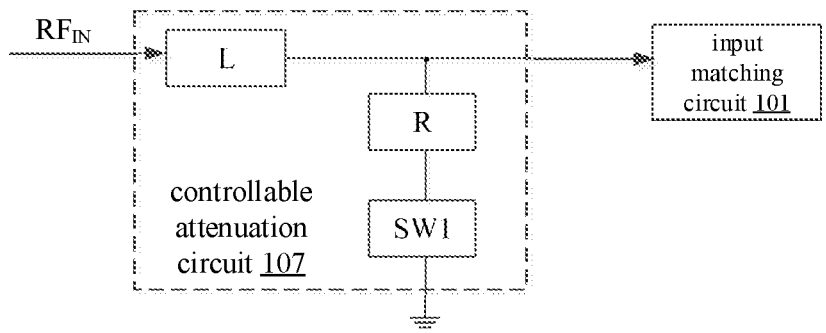
FIG. 3 is a schematic diagram of a controllable attenuation circuit provided by an embodiment of the disclosure.

The structure of the controllable attenuation circuit of FIG. 2A is illustrated in FIG. 3, and the controllable attenuation circuit includes an inductor L, and a resistor R and a switch SW1 serially grounded and in parallel to the inductor L.

Herein, the series inductor L is configured to match the parasitic capacitance of SW1, in turn-off state, of the branch grounded and in parallel to the inductor L, so as to reduce the impact on the input matching circuit of the post-stage drive amplification circuit. In the negative gain mode, the SW1 is in the turn-on state, and the resistor R is mainly responsible for the attenuation of the radio frequency input power after being split, ant the SW1 is mainly responsible for the turn-on of the radio frequency input branch and the ground (GND). When the system requires a very low gain, the R may also be omitted, and the parasitic resistance when the SW1 itself is turned on is used for the absorption and attenuation of the radio frequency power. The switch herein may be realized by using various semiconductor processes, such as Complementary Metal Oxide Semiconductor (CMOS), Silicon on Insulator (SOI) CMOS transistor, PIN diodes, etc., and herein the PIN indicates: by adding a thin layer of low-doped Intrinsic semiconductor between P and N semiconductor materials, the diode with such P-I-N structure is a PIN diode.

It should be noted that the relationship between the controllable attenuation circuit where R is located and the post-stage power amplification circuit is a parallel connection relationship. The parallel connection relationship means under the same voltage, the smaller the R is, the greater the current shared by the controllable attenuation circuit is, and the more power is obtained. Therefore, the smaller the R is, the more power enters the controllable attenuation circuit, correspondingly the less power enters the post-stage power amplification circuit is, and the greater the attenuation is. Therefore, in order to achieve the maximum attenuation, the R sometimes needs to be omitted, relying only on the turn-on resistance Ron of the SW1 itself.

Herein, the series inductor L1 is obtained by the following ways:

In the case of not adding the controllable attenuation circuit, when the corresponding impedance of the input matching circuit 101 is: $Z0=R0+jX0$, and R0 is the equivalent resistance of the input matching circuit 101, and X0 is the equivalent reactance of the input matching circuit 101, then this impedance is conjugate matched with the input impedance Zin at the $RF_{IN}$ end, and $Zin=R0−jX0$; after adding the controllable attenuation circuit, in the branch, where the R2 and SW1 are located, which is grounded and in parallel to the inductor L and in front of the input matching circuit 101, in order to ensure effective power attenuation, the R2 is generally controlled to have a small value, so its impact on R0 may be negligible. When the SW1 is turned off, the branch where the R2 and SW1 are located may be equivalent to the parasitic reactance $X_C$, at this time, the equivalent impedance Zeq of the controllable attenuation circuit and the input matching circuit is $Zeq=(R0+jX0)//(jX_C+jX_L)$, herein, the VP indicates the parallel connection, the real part of Zeq is less than R0, and $X_L$ is the equivalent reactance of the inductor L1, and in order to match the equivalent impedance with the input impedance as closely as possible and reduce the impact, the imaginary part Im(Zeq) of Zeq needed to be $Im(Zeq)=X0$, and with the known values of R0, X0 and $X_C$, the $X_L$ may be calculated according to the expression of the equivalent impedance Zeq, and thus the inductance of the inductor L1 is obtained, and herein, since the inductor L1 is integrated into the silicon-based chip, the value of the quality factor Q of the inductor L is generally not greater than 5.

Figure 4:
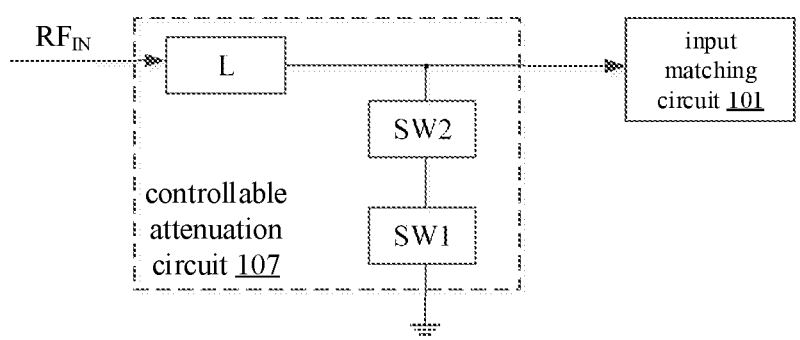
FIG. 4 is a schematic diagram of another controllable attenuation circuit provided by an embodiment of the disclosure.

In order to further improve the practicability of the circuit and to improve the capability of radio frequency voltage tolerance and ESD, a further form of the embodiments of the disclosure is to replace the R of the branch in parallel with two switches SW1 and SW2, as illustrated in FIG. 4, and to control the turn-on parasitic resistance and turn-off parasitic capacitance as well as the capability of ESD by controlling the width-length ratio of the gate of the SW1 and SW2. In other words, by controlling the width-length ratio W/L of the gate of the SW1 and SW2 during the design, the desired Ron may be obtained, herein, the resistance Ron of the turn-on switch is: $Ron=1/(\mu*Cox*(W/L)*(VGS−VTH))$, herein, * represents the multiplication sign, and μ is the electron mobility, Cox is the capacitance of the gate oxide layer per unit area, W/L is the width-length ratio of the effective channel length of the CMOS device, VGS is the gate-source voltage, and the VTH is the threshold voltage.

The parasitic capacitance Coff of the turn-off switch is: $Coff=FOM/Ron$. Herein, FOM is the product of Ron and Coff, in fs (femtoseconds), provided by the semiconductor processors. In addition, the larger W/L is advantageous to provide a direct drain channel of a low impedance current in the event of ESD. Superimposing two switches SW1 and SW2 is capable of preventing the MOS transistor of the switch SW from being damaged under high ESD current, as compared to single switch SW.

When the two switches SW1 and SW2 of the controllable attenuation circuit take a stacked-transistor design, the control logics of the two switches SW1 and SW2 are the same: (1) in the non-negative gain mode, the SW1 and SW2 are turned off at the same time; (2) in the negative gain mode, the SW1 and SW2 are turned on at the same time.

The SW1 and SW2 of the embodiments of the disclosure may adopt Silicon on Insulator (SOI) CMOS transistors or may be Bulk CMOS transistors (planar structured MOS transistors) during the application.

Figure 5A:
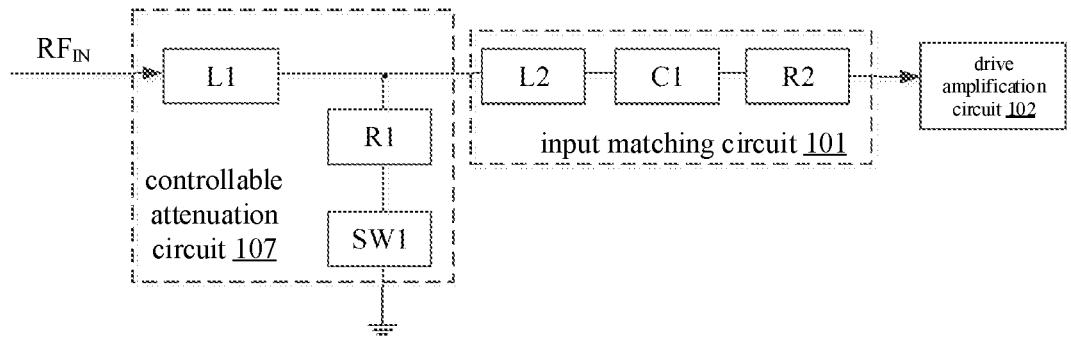
FIG. 5A is a schematic diagram of a controllable attenuation circuit and an input matching circuit provided by an embodiment of the disclosure.

The following provides a structure adopting a controllable attenuation circuit and an input matching circuit as illustrated in FIG. 5A, and in FIG. 5A, L2, C1 and R2 form the input matching circuit in front of the drive amplification stage circuit, which may match the impedance of the input port to an input impedance position suitable for a radio frequency power amplifier circuit, this is because the drive amplification stage circuit requires a specific impedance range for the output power to achieve the performance such as the desired efficiency and gain and so on.

The inductor L1, which is in front of the SW1 and R1 of the branch grounded and in parallel to the inductor L1, of the controllable attenuation circuit, is configured to compensate for the matching of the parasitic capacitance of the branch grounded and in parallel to the inductor L1. In the high gain mode, the input of such radio frequency power amplifier circuit has a simple matching structure with a good input port matching, so the return loss at the input end is good, and because the inductor of the designed controllable attenuation circuit has a low quality factor Q, the characteristics of frequency-selectivity are not obvious, and the bandwidth of frequency response is wide, which brings a relatively small insertion loss of the radio frequency signal. The return loss and the bandwidth of frequency response in the negative gain mode also meet the requirements.

Assuming that fH is the upper limit frequency, and fL is the lower limit frequency, fo is the center frequency; and fH=900 MHz, fL=600 MHz, fo=800 MHz, the return loss is greater than 15 dB, the absolute bandwidth of frequency response may be up to more than 300 MHz, the relative bandwidth may be up to (fH−fL)/fo=(900−600)/800=37.5%.

Figure 5B:
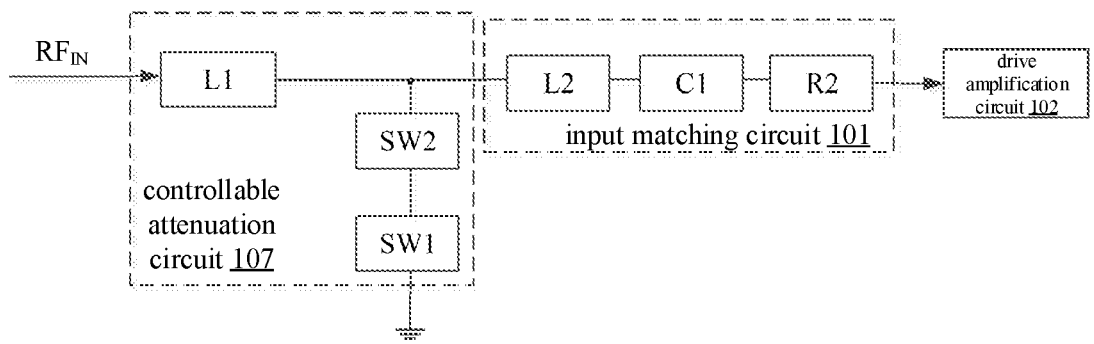
FIG. 5B is a schematic diagram of another controllable attenuation circuit and an input matching circuit provided by an embodiment of the disclosure.

A further structure adopting a controllable attenuation circuit and an input matching circuit is provided below, as illustrated in FIG. 5B, and the resistor R1 of the controllable attenuation circuit of this structure may be changed into a switch SW2 to enhance the capability of ESD of the radio frequency input port $RF_{IN}$.

Figure 10:
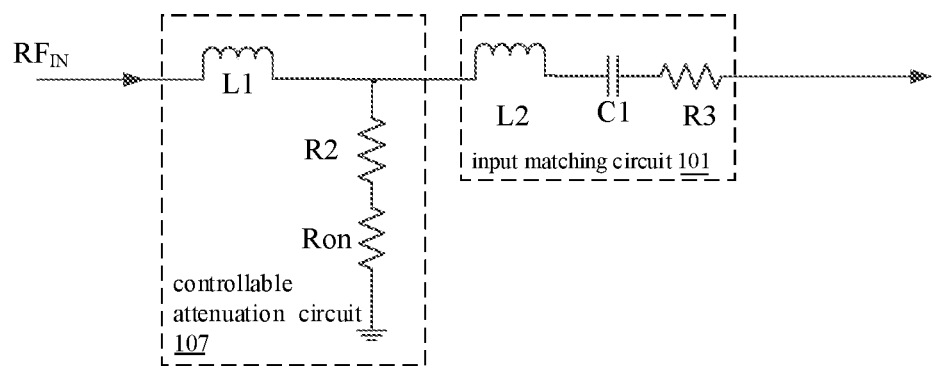
FIG. 10 is a schematic diagram of a controllable attenuation circuit and an input matching circuit provided by an embodiment of the disclosure.

When the first switch SW1 is turned on, the first switch SW1 of the controllable attenuation circuit is equivalent to the parasitic resistor Ron, as illustrated in FIG. 10, and the diagrams of components corresponding to each of the blocks in FIG. 5A are also illustrated in FIG. 10.

Advantageously, by designing a controllable attenuation circuit at the input end of the signal, the negative gain of the power amplifier gain can be achieved with little impact on the performance of the high gain mode, and the ESD of the $RF_{IN}$ port is enhanced. The circuit has a simple structure and a small occupied area on the chip, which may reduce the hardware cost thereof.

Figure 6:
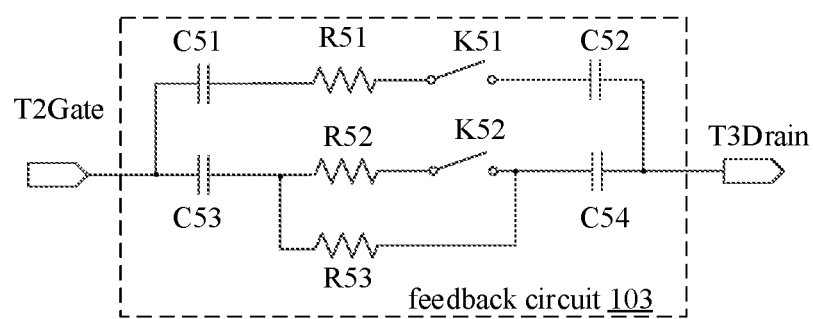
FIG. 6 is a schematic diagram of a feedback circuit provided by an embodiment of the disclosure.

In the radio frequency power amplifier circuit provided by the embodiments of the disclosure, there are various types of resistors that may be configured to switch, in the feedback circuit, e.g. when the radio frequency power amplifier circuit needs to achieve three gain modes: a high gain of about 30 dB, a low gain of about 15 dB and a negative gain of about −10 dB. At this time, in the feedback circuit as illustrated in FIG. 6, C51, C52, C53 and C54 are capacitors with a capacitance value in the range of 1 pF to 2 pF. Resistance of R53 is greater than that of R51, and resistance of R51 is greater than that of R52, for example, resistance of R53=5KΩ, resistance of R51=1KΩ resistance of R52=100Ω. In the specific feedback circuit, a capacitor is used on both sides of each group of resistors, and the reason is that both ends of the switch need a zero DC voltage bias in the specific circuit, therefore, the DC voltage is isolated first by a capacitor. The greater the feedback depth the feedback circuit is, the lower the gain of the drive amplification circuit is, the smaller the switching resistors used need to be.

Here, the switching logic of the feedback circuit is as follows:

High gain mode: switches K51 and K52 are turned off.
Low gain mode: the switch K51 is turned on, and K52 is turned off.
Negative gain mode: switches KM and K52 are turned on.
Assuming that amplification coefficient of the radio frequency power amplifier circuit without adding the feedback circuit is A, and the feedback coefficient of the feedback circuit is F, then the amplification coefficient Af of the radio frequency power amplifier circuit with the feedback circuit added is Af=A/(1+AF), and with the reduction of the resistance value of the equivalent resistor of the feedback circuit, the feedback coefficient F becomes greater, the feedback depth increases, the amplification coefficient Af becomes less, that is, to achieve the reduction of a part of gains of the negative feedback circuit.

As illustrated in FIG. 7, the drain current bias circuit of T2 is formed by the connection of the internal current sources IB, T6, R6, R7 and C12 in accordance with FIG. 7. The parameter of the width-length ratio W/L of T2 and T6 is proportional to A (A is much greater than 1), which allows the bias current of the drain of T2 to approximate A times IB. R6, R7 and C12 form a T-shaped network that serves to isolate the radio frequency signal of the $RF_{IN}$ end. The current source may be designed in the actual analog circuit to divide the current IB into multiple levels and the switching of the IB levels is controlled through a digital register to achieve the effect of current switching of the drain of T2.

The voltage bias circuit of the gate of T3 is formed by the connection of the internal voltage sources VG, R8, R9 and C13 in accordance with FIG. 7. R8, R9 and C13 form a T-network that serves to isolate the weak radio frequency voltage amplitude of the gate of T3. The voltage source may be designed in the actual analog circuit to divide the voltage VG into multiple levels and the switching of the VG levels is controlled through a digital register (belonging to the microcontroller) to achieve the effect of voltage switching of the gate of T3.

Herein, the structure of stacked-transistor composed of T4 and T5 is the same as the structure of stacked-transistor composed of T2 and T3. The device sizes of T2 and T3 are the same, and the device sizes of T4 and T5 are the same. The ratio of the device sizes of T2 (T3):T4 (T5) is a relationship of 2:5. For example, the channel width of each of the MOS transistors T2 and T3 is about 2 mm, and the channel width of each of the MOS transistors T4 and T5 is 5 mm. Then in the non-negative gain mode: Vcc=2.5V, the bias current IB of T2 equals to about 12 mA, the bias current IB of T4 equals to about 45 mA, the VG of T3 and T5 equals to 2.3V. In the negative gain mode: Vcc=0.5V, the bias current IB of T2 equals to about 2 mA, the bias current IB of T4 equals to about 6 mA; the VG of T3 and T5 equals to 1.5V.

In the radio frequency power amplifier circuit provided by the embodiments of the disclosure, the inter-stage matching circuit has been simplified to illustrate the design of a controllable attenuation circuit for input matching, and the actual inter-stage matching circuit is a more complicated LCCL network. The inter-stage matching circuit has a large capacitance value of C7, and C7 and R6 are grounded in parallel at the radio frequency. It should be noted that in the embodiments of the disclosure, the concept of matching is directed to the radio frequency signal, and C7 indicates a radio frequency short circuit, which may be omitted from the equivalent radio frequency circuit.

In addition, the structures of the circuits of the drive amplification circuit and the power amplification circuit are the same, but the device sizes corresponding to the two circuits differ greatly. In comparison, the power amplification circuit pays more attention to the efficiency of the output amplification signal, while the drive amplification circuit pays more attention to the gain control of the amplification signal.

In the high, medium and low power modes of the radio frequency power amplifier circuit, the structure of the circuit and the DC bias need to be switched, that is, by cooperation of changing the switches of the feedback circuit, the gate voltage of the voltage bias circuit, the current of the drain of the current bias circuit, the supply voltage Vcc, and enabling the controllable attenuation circuit, the above power modes as well as the non-negative gain mode and the negative gain mode are realized.

FIG. 2B is a schematic diagram of the circuit structure of a radio frequency power amplifier circuit provided by some embodiments of the disclosure, and as illustrated in FIG. 2B, the radio frequency power amplifier circuit is applied to a terminal, including:

a controllable attenuation circuit 107, an input matching circuit 101, a drive amplification circuit 102, an inter-stage matching circuit 103, a power amplification circuit 105 and an output matching circuit 106 connected in sequence, and a feedback circuit 103 connected across the drive amplification circuit 102;

the controllable attenuation circuit 107 configured to switch between a negative gain mode and a non-negative gain mode of the radio frequency power amplifier circuit based on a mode control signal transmitted by a microprocessor of the terminal;

the input matching circuit 101 configured to match the impedance between the controllable attenuation circuit and the drive amplification circuit;

the drive amplification circuit 102 configured to amplify a signal output from the input matching circuit;

the feedback circuit 103 configured to adjust a gain of the radio frequency power amplifier circuit;

the inter-stage matching circuit 104 configured to match the impedance between the drive amplification circuit and the power amplification circuit;

the power amplification circuit 105 configured to amplify a signal output from the inter-stage matching circuit; and the output matching circuit 106 configured to match the impedance between the radio frequency power amplifier circuit and a post-stage circuit.

Herein, the radio frequency power amplifier circuit is applied to a terminal, and the corresponding mode may be selected according to the distance between the terminal and the base station. When the distance between the terminal and the base station is short, the path loss is low, and the communication between the terminal and the base station requires the output power of the radio frequency power amplifier circuit to be low, and the radio frequency power amplifier circuit is in the negative gain mode now, and the input signal is attenuated to a certain extent, and the output signal with a low output power may be obtained; when the distance between the terminal and the base station is long, the path loss is high, and the communication between the terminal and the base station requires the output power of the radio frequency power amplifier circuit to be high, and the radio frequency power amplifier circuit is in the non-negative gain mode now, and the input signal is amplified to a certain extent, and the output signal with a high output power may be obtained.

In one possible example, the mode control signal includes a first control signal and a second control signal, herein, the first control signal characterizes when the radio frequency power amplifier circuit is switched to the non-negative gain mode, the controllable attenuation circuit is configured to control the controllable attenuation circuit itself in a non-attenuation state in response to the first control signal; and the second control signal characterizes when the radio frequency power amplifier circuit is switched to the negative gain mode, the controllable attenuation circuit is configured to control the controllable attenuation circuit itself in an attenuation state in response to the second control signal.

Herein, when the controllable attenuation circuit is in the non-attenuation state, the controllable attenuation circuit does not operate; and when the controllable attenuation circuit is in the attenuation state, the controllable attenuation circuit operates to absorb and attenuate the radio frequency power through the resistor of the controllable attenuation circuit, so that the radio frequency power entering the subsequent circuit decreases and the input signal is attenuated, thus realizing the negative gain.

In one possible example, the controllable attenuation circuit includes a first resistor R1, a second resistor R2, a first inductor L1 and a first switch T1, a gate of the first switch connected with a first end of the first resistor, a second end of the first resistor is connected with a first voltage signal, and a drain of the first switch is connected with a first end of the second resistor, and a source of the first switch is grounded, and a first end of the first inductor is connected with an input signal, and a second end of the first inductor is connected with a second end of the second resistor;

herein, the first switch is configured to turn the first switch itself off in response to the first control signal from the microprocessor, so as to allow the controllable attenuation circuit to be in the non-attenuation state so that the radio frequency power amplifier circuit is in the non-negative gain mode;

the first switch is also configured to turn the first switch on in response to the second control signal from the microprocessor, so as to allow the controllable attenuation circuit to be in the attenuation state so that the radio frequency power amplifier circuit is in the negative gain mode;

herein, the first control signal is a first voltage signal with a first voltage value and the second control signal is the first voltage signal with a second voltage value, and the first voltage value is different from the second voltage value.

It should be noted that the first switch is a silicon on insulator CMOS transistor, or a planar structured MOS transistor. The first resistor is a pull-up resistor with a small resistance, and the first voltage signal Vgg is connected with the first switch through the first resistor.

In some embodiments, the microprocessor controls Vgg=−2.5V, so that the first switch is turned off, and the controllable attenuation circuit is in the non-attenuation state, and the input matching circuit is isolated from the controllable attenuation circuit, at this time, the radio frequency power amplifier circuit amplifies the input signal and the non-negative gain mode is realized for the radio frequency power amplifier circuit;

The microprocessor controls Vgg=2.5 V, so that the first switch is turned on, and the controllable attenuation circuit is in the attenuation state, at this time, a part of radio frequency conduction powers enters the controllable attenuation circuit and becomes thermal energy to be consumed, the other part of radio frequency conduction powers enters the circuit after the controllable attenuation circuit, and the input signal is attenuated, and the non-negative gain mode is realized for the radio frequency power amplifier circuit.

When the first switch is turned off, the first inductor is configured to match the parasitic capacitance to reduce the impact on the post-stage circuit, and the first switch may be equivalent to the parasitic capacitor Coff regardless of the first resistor, and the controllable attenuation circuit is equivalent to the circuit illustrated in FIG. 8A;

When the first switch is turned on, the first switch is equivalent to the parasitic resistor Ron, regardless of the first resistor, and the controllable attenuation circuit is equivalent to the circuit illustrated in FIG. 8B, and since the second resistor and the parasitic resistor Ron are small, so the current flowing into the controllable attenuation circuit is large, and the circuit consumes more power and has a stronger attenuation effect on the input signal. Herein, in order to realize the maximum degree of attenuation, in the non-negative gain mode, the resistance of the controllable attenuation circuit should be as low as possible, the second resistor R2 may be omitted from the controllable attenuation circuit, so as to attenuate the input signal only through the parasitic resistor Ron.

When there is no second resistor in the controllable attenuation circuit, the parasitic resistance of the first switch may also be determined when the negative gain of the radio frequency power amplifier circuit is determined. When the first switch is turned on, the first switch operates in a linear region and the resistance of the parasitic resistor Ron satisfies the equation: $Ron=1/(\mu \times Cox \times (W/L) \times (V_{GS}-V_{TH}))$, herein, $\mu$ is the electron mobility, Cox is the capacitance of the gate oxide layer per unit area, W/L is the width-length ratio of the effective channel length of the first switch T1, VGS is the gate-source voltage, $V_{TH}$ is the threshold voltage, and since the gate length L is fixed, a MOS transistor with a parasitic resistance Ron may be obtained by designing the gate width W. The parasitic capacitance $C_{off}$=FOM/Ron, and FOM, in fs (femtoseconds), is a parameter provided by the semiconductor processors, and after the parasitic resistance Ron is determined, the parasitic capacitance $C_{off}$ may be determined, so that the parameters related to the first switch of the controllable attenuation circuit may be determined.

In one possible example, the controllable attenuation circuit includes a first resistor, a reserved resistor RN, a first inductor, a first switch and a reserved switch TN, and a gate of the first switch is connected with a first end of the first resistor, a second end of the first resistor is connected with a first voltage signal, a drain of the first switch is connected with a source of the reserved switch, a source of the first switch is grounded, a gate of the reserved switch is connected with a first end of the reserved resistor, a second end of the reserved resistor is connected with the first voltage signal, a drain of the reserved switch is connected with a first end of the first inductor, and a second end of the first inductor is connected with an input signal;

herein, the first switch and the reserved switch are configured to turn the first switch and the reserved switch themselves off in response to the first control signal from the microprocessor, so as to allow the controllable attenuation circuit to be in the non-attenuation state so that the radio frequency power amplifier circuit is in the non-negative gain mode;

the first switch and the reserved switch are also configured to turn the first switch and the reserved switch themselves on in response to the second control signal from the microprocessor, so as to allow the controllable attenuation circuit to be in that attenuation state so that the radio frequency power amplifier circuit is in the negative gain mode;

herein, the first control signal is a first voltage signal with a first voltage value and the second control signal is the first voltage signal with a second voltage value, and the first voltage value is different from the second voltage value.

Figure 9:
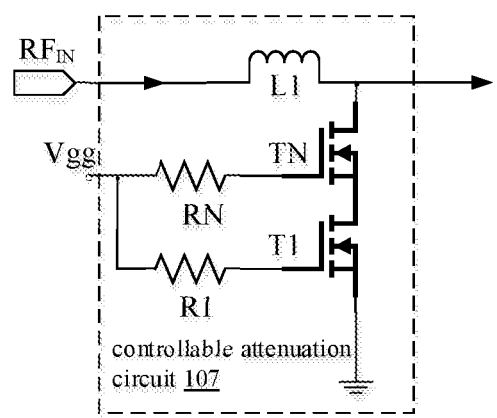
FIG. 9 is a schematic diagram of a controllable attenuation circuit provided by an embodiment of the disclosure.

Herein, to further improve the capability of voltage tolerance and ESD, a controllable attenuation circuit as illustrated in FIG. 9 may be adopted, which replaces the second resistor with a reserved switch and a reserved resistor, and the first control signal Vgg is connected with the first switch through the first resistor and connected with the reserved switch through the reserved resistor. The parameters of the reserved resistor are the same as those of the first resistor, and the two resistors are configured as pull-up resistors to supply power to the switch. The parameters of the reserved switch are the same as those of the first switch, and the parasitic resistance of each of the first switch and the reserved switch is half of the parasitic resistance Ron of a single switch, so that the overall parasitic resistance of the double switch is the same as that of the single switch.

The control logics of the first switch and the reserved switch are the same: in the non-negative gain mode, the first switch and the reserved switch are turned off at the same time; and in the negative gain mode, the first switch and the reserved switch are turned on at the same time, regardless of the first resistor R1 and the reserved resistor RN.

The first switch and the reserved switch are N-type Metal-Oxide-Semiconductor (MOS) field effect transistors, and the specific type thereof may be a silicon on insulator MOS transistor or a planar structured MOS transistor.

It can be seen that in the embodiments of the disclosure, because of the use of the stacked-transistor design, the first switch and the reserved switch are stacked on each other, so that the capacity of voltage tolerance and ESD of the MOS transistor are improved, and compared with a single MOS transistor, the first switch and the reserved switch may be better protected from damage under a high current.

In one possible example, the input matching circuit 101 includes a third resistor R3, a first capacitor C1 and a second inductor L2, and a first end of the second inductor is connected with the second end of the second resistor, a second end of the second inductor is connected with a first end of the first capacitor, and a second end of the first capacitor is connected with a first end of the third resistor.

In FIG. 9, assuming that the input impedance $Z_{in}$ of the input end is $Z_{in}$=R0−jX0, the equivalent impedance Z20 of the controllable attenuation circuit is Z20=R20+jX20, and the equivalent impedance Z30 of the input matching circuit is Z30=R30+jX30, and in order to realize a conjugate matching of Z20 and $Z_{in}$, it is necessary to satisfy: R20+R30=R0, X20+X30=X0, and in the case of $Z_{in}$ and Z30 being known, R20 and X20 may be calculated, and furthermore, in the case where the parameters of the second resistor and the first switch are known, the parameters of the first inductor may be calculated. Since the equivalent impedance Z20+Z30 may match well with the input impedance $Z_{in}$ after adding the input matching circuit, the return loss at the input end may meet the requirements.

Herein, because the first inductor is integrated on the silicon-based chip, the quality factor of the first inductor is generally not greater than 5. Because the quality factor of the first inductor is small, the characteristics of frequency-selectivity of the controllable attenuation circuit are not obvious and the bandwidth of frequency response is wide in the non-negative gain mode. In the negative gain mode, the return loss and the bandwidth of frequency response may also meet the requirements.

In one possible example, the drive amplification circuit 102 includes a second capacitor C2, a second MOS transistor T2 and a third MOS transistor T3, herein, a gate of the second MOS transistor is connected with a second end of the third resistor, a drain of the second MOS transistor is connected with a source of the third MOS transistor, a source of the second MOS transistor is grounded, a first end of the second capacitor is connected with a gate of the third MOS transistor, and a second end of the second capacitor is grounded.

Herein, the second MOS transistor T2 and the third MOS transistor T3 have the same device sizes.

In one possible example, the feedback circuit 103 includes a third capacitor C3, a fourth capacitor C4, a fifth capacitor C5, a sixth capacitor C6, a fourth resistor R4, a fifth resistor R5 and a second switch Kl, herein, a first end of the fourth capacitor and a first end of the sixth capacitor are connected with a drain of the third MOS transistor, a second end of the fourth capacitor is connected with a first end of the fourth resistor, a second end of the fourth resistor is connected with a first end of the third capacitor, a second end of the sixth capacitor is connected with a first end of the first switch, a second end of the second switch is connected with a first end of the fifth resistor, a second end of the fifth resistor is connected with a first end of the fifth capacitor, a second end of the fifth capacitor and a second end of the third capacitor are connected, and the common node of the fifth and third capacitors is connected with the common node of the third resistor and the gate of the second MOS transistor T2;

Herein, the first switch is configured to turn the first switch itself off in response to a seventh control signal from the microprocessor, so as to reduce a feedback depth so that the radio frequency power amplifier circuit is in the non-negative gain mode;

the first switch is also configured to turn the first switch itself on in response to an eighth control signal to increase the feedback depth so that the radio frequency power amplifier circuit is in the negative gain mode.

It should be noted that assuming that amplification coefficient of the radio frequency power amplifier circuit without adding the feedback circuit is A, and the feedback coefficient of the feedback circuit is F, then the amplification coefficient Af of the radio frequency power amplifier circuit 100 with the feedback circuit added is Af=A/(1+AF), and with the reduction of the resistance value of the equivalent resistance of the feedback circuit, the feedback coefficient F becomes greater, the feedback depth increases, the amplification coefficient Af becomes less, and it is beneficial to realize the negative gain mode for the radio frequency power amplifier circuit.

Herein, the resistance of the fourth resistor is greater than the resistance of the fifth resistor. The second switch turns the second switch itself off in response to the seventh control signal from the microprocessor, so as to reduce the feedback depth, thereby realizing the non-negative gain mode for the radio frequency power amplifier circuit; and the second switch turns the second switch itself on in response to the eighth control signal from the microprocessor, so as to increase the feedback depth, thereby realizing the negative gain mode for the radio frequency power amplifier circuit.

In some embodiments, the feedback circuit may also be illustrated in FIG. 6, including a capacitor CM, a capacitor C52, a capacitor C53, a capacitor C54, a resistor R51, a resistor R52, a resistor R53, a switch KM and a switch K52, and the capacitor CM, the resistor R51, the switch KM and the capacitor C52 are connected in sequence to form a first branch, and the capacitor C53, the resistor R52, the resistor R53, the switch K52, the capacitor C54 form a second branch, and the first branch is connected in parallel with the second branch, herein, two ends of the capacitor C53 are connected with one end of the capacitor C51 and one end of the resistors R52 respectively, and two ends of the switch K52 are connected with the other end of the resistor R52 and one end of the capacitor C54 respectively, and two ends of the resistor R53 are connected with one end of the resistor R52 and one end of the capacitor C54 respectively, and the other end of the capacitor C54 is connected with the capacitor C52.

Herein, the capacitances of the capacitor CM, the capacitor C52, the capacitor C53 and the capacitor C54 are in the range of 1 pF to 2 pF. In the circuit, because two ends of the switch need a zero DC voltage bias, a capacitor is used on each side of the resistor R52 and the resistor R53 for DC isolating. The smaller the equivalent resistance of the feedback circuit is, the greater the feedback depth is, and the lower the gain of the radio frequency power amplifier circuit is, therefore, the resistance of the resistor R53 is set to be greater than the resistance of the resistor R51 and the resistance of the resistor R51 is set to be greater than the resistance of the resistor R52. The microcontroller controls the switch K51 and the switch K52 to be turned off, at this time, the equivalent resistance of the feedback circuit is the maximum, and the high gain may be realized; and the microcontroller controls the switch K51 to be turned on and the switch K52 to be turned off, at this time, the low gain may be realized; and the microcontroller controls the switch KM and the switch K52 to be turned on, at this time, the equivalent resistance of the feedback circuit is the minimum, and the negative gain may be realized. In some embodiment, when the high gain of the radio frequency amplifier circuit is about 30 dB, the low gain is about 15 dB and the negative gain is about −10 dB, the resistance of the resistor R53 may be set to be 5KΩ and the resistance of the resistor R51 may be set to be 1KΩ, and the resistance of the resistor R52 may be set to be 100Ω. It should be noted that the specific form of the feedback circuit is not limited in the embodiment.

It can be seen that by controlling the turn-on/turn-off of the second switch of the feedback circuit, the amplitude of the gain of the radio frequency power amplifier circuit may be changed to realize a wide range of gain adjustment.

In one possible example, the inter-stage matching circuit 104 includes a third inductor L3, a seventh capacitor C7 and an eighth capacitor C8, herein, a first end of the third inductor is connected with the drain of the third MOS transistor, a second end of the third inductor is connected with a second voltage signal and a first end of the seventh capacitor, a first end of the seventh capacitor is connected with the second voltage signal, a second end of the seventh capacitor is grounded, and a first end of the eighth capacitor is connected with the drain of the third MOS transistor.

Herein, the second voltage signal is Vcc. In the embodiments of the disclosure, the inter-stage matching circuit is simplified to be represented by the third inductor, the seventh capacitor and the eighth capacitor, in consideration of the complexity of the inter-stage matching circuit.

In one possible example, the power amplification circuit 105 includes a fourth MOS transistor T4, a fifth MOS transistor T5 and a ninth capacitor C9, herein, a gate of the fourth MOS transistor is connected with a second end of the eighth capacitor, a drain of the fourth MOS transistor is connected with a source of the fifth MOS transistor, a source of the fourth MOS transistor is grounded, a gate of the fifth MOS transistor is connected with a first end of the ninth capacitor, and a second end of the ninth capacitor is grounded.

Herein, the device sizes of the fourth MOS transistor T4 and the fifth MOS transistor T5 are the same, and the ratio of the device size of the second MOS transistor T2 to that of the fourth MOS transistor T4 is 2:5.

In one possible example, the output matching circuit 106 includes a fourth inductor L4, a fifth inductor L5, a tenth capacitor C10 and an eleventh capacitor C11, herein, a first end of the fourth inductor and a first end of the fifth inductor are connected with a drain of the fifth MOS transistor, a second end of the fourth inductor is connected with a second voltage signal, a first end of the tenth capacitor is connected with the second voltage signal, a second end of the tenth capacitor is grounded, a second end of the fifth inductor is connected with a first end of the eleventh capacitor, a second end of the eleventh capacitor is grounded, and the voltage at both ends of the eleventh capacitor is the output voltage.

In one possible example, the radio frequency power amplifier circuit further includes:

a first bias circuit configured to increase a drain current and a gate voltage of the first bias circuit itself in response to a third control signal from the microprocessor, so that the radio frequency power amplifier circuit is in the non-negative gain mode; and the first bias circuit further configured to reduce the drain current and the gate voltage of the first bias circuit itself in response to a fourth control signal, so that the radio frequency power amplifier circuit is in the negative gain mode;

a second bias circuit configured to increase a drain current and a gate voltage of the second bias circuit itself in response to a fifth control signal from the microprocessor, so that the radio frequency power amplifier circuit is in the non-negative gain mode; and the second bias circuit also configured to reduce the drain current and the gate voltage of the second bias circuit itself in response to a sixth control signal, so that the radio frequency power amplifier circuit is in the negative gain mode;

herein, the first bias circuit is connected with the drive amplification circuit and the second bias circuit is connected with the power amplification circuit.

Herein, as illustrated in FIG. 7, the first bias circuit 1020 includes a second MOS transistor T2, a third MOS transistor T3, a sixth MOS transistor T6, a first current source IB, a first voltage source VG, a sixth resistor R6, a seventh resistor R7, an eighth resistor R8, a ninth resistor R9, a second capacitor C2, a seventh capacitor C7, a twelfth capacitor C12 and a thirteenth capacitor C13.

The drain current bias circuit of the second MOS transistor is formed by the connection of the first current source, the sixth MOS transistor, the sixth resistor, the seventh resistor and the twelfth capacitor in accordance with FIG. 7. The sixth resistor, the seventh resistor and the twelfth capacitor form a T-shaped network that serves to isolate the input signal. The width-length ratio W/L of the second MOS transistor is C (C is much greater than 1) times the width-length ratio of the sixth MOS transistor, so the drain bias current of the second MOS transistor is approximately C times that of the first current source, so as to realize the current amplification. There are multiple adjustable levels for the first current source, and the drain current of the second MOS transistor may be switched through controlling the switching of the levels of the first current source according to the third control signal and the fourth control signal transmitted by the microprocessor, so as to adjust the amplification factor of the drive amplification circuit.

The gate voltage bias circuit of the third MOS transistor T3 is formed by the connection of the first voltage source VG, the eighth resistor R8, the ninth resistor R9 and the thirteenth capacitor C13 in accordance with FIG. 7. The eighth resistor, the ninth resistor and the thirteenth capacitor form a T-shaped network that serves to isolate the radio frequency voltage amplitude of the gate of the third MOS transistor. There are multiple adjustable levels for the first voltage source, and the gate voltage of the third MOS transistor may be switched through controlling the switching of the levels of the first voltage source according to the fifth control signal and the sixth control signal transmitted by the microprocessor, so as to adjust the amplification factor of the drive amplification circuit.

The radio frequency power amplifier circuit is in different gain modes by adjusting the amplification factor of the drive amplification circuit.

The second voltage signal Vcc is configured to power the drains of the second MOS transistor and the third MOS transistor, herein, the amplitude of Vcc is controlled by the microprocessor. In some embodiments, when the channel width of each of the second MOS transistor and the third MOS transistor is 2 mm, the microcontroller controls Vcc to be 2.5V, controls the first current source to be 12 mA, and controls the first voltage source to be 2.3V, so as to realize the non-negative gain mode for the radio frequency power amplifier circuit; and the microcontroller controls Vcc to be 0.5V, controls the first current source to be 2 mA, and controls the first voltage source to be 1.5 V, so as to realize the negative gain mode for the radio frequency power amplifier circuit. Apparently, more levels of the first voltage source and more levels of the first current source may be set, and the gain may be linearly adjusted by switching different levels of the voltage source, and different levels of the current source, and by controlling the supply voltage Vcc to the drains of the second MOS transistor and the third MOS transistor.

It should be noted that the structure of the second bias circuit is the same as that of the first bias circuit, and the method for adjusting the second bias circuit is also the same as that for adjusting the first bias circuit, and when the channel width of each of the fourth MOS transistor and the fifth MOS transistor is 5 mm, the microcontroller controls the current source corresponding to the fourth MOS transistor to be 45 mA, and controls the voltage source corresponding to the fifth MOS transistor to be 2.3V, so as to realize a non-negative gain mode for the radio frequency power amplifier circuit; and the microcontroller controls the current source corresponding to the fourth MOS transistor to be 6 mA, and controls the voltage source corresponding to the fifth MOS transistor to be 1.5V, so as to realize a negative gain mode for the radio frequency power amplifier circuit.

It may be seen that the microcontroller may control the drain currents of the second and fourth MOS transistors, and the gate voltage of the third and fifth MOS transistors, and may further adjust the amplification factors of the drive amplification circuit and the power amplification circuit, so as to realize a linear adjustment of the gain of the radio frequency power amplifier circuit.

According to the above embodiments, when the radio frequency power amplifier circuit is required to be in the non-negative gain mode, the microcontroller is required to control the first switch to be turned off, control the second switch to be turned off, control the first bias circuit so that the drain current of the second MOS transistor and the gate voltage of the third MOS transistor become larger, and control the second bias circuit so that the drain current of the fourth MOS transistor and the gate voltage of the fifth MOS transistor become larger. Herein, when the second switch is turned off, the amplification coefficient Af of the feedback circuit becomes greater, which is advantageous to the amplification of the input signal, and the drain currents, the gate voltages and the drain supply voltages of the first and second bias circuits become greater, which are also advantageous to the amplification of the input signal, and when the first switch is turned off, the controllable attenuation circuit is isolated, which has less impact on the input signal, and the amplification of the input signal may be realized by such control. When the output power (which is relatively large) of the radio frequency power amplifier circuit is determined, the microprocessor may further obtain its input power and gain value, and the microprocessor adjusts the input power, controls the voltage signal Vgg, turns the first switch off, controls the second switch to be turned off, controls the internal current sources and internal voltage sources of the first and second bias circuits, and controls the drain power supply voltage Vcc, so as to reduce the drain current and gate voltage of the bias circuit, so that the overall gain of the radio frequency power amplifier circuit meets the requirements. When the radio frequency power amplifier circuit is required to be in the negative gain mode, the microcontroller is required to control the first switch to be turned on, control the second switch to be turned on, control the first bias circuit so that the drain current of the second MOS transistor, the gate voltage of the third MOS transistor and the drain supply voltage Vcc become smaller, and control the second bias circuit so that the drain current of the fourth MOS transistor, the gate voltage of the fifth MOS transistor and the drain supply voltage Vcc become smaller. Herein, when the second switch is turned on, the amplification coefficient Af of the feedback circuit is relatively small and has non-obvious impact on the amplification of the input signal, and the drain currents and gate voltages of the first and second bias circuits are relatively small and also have non-obvious impact on the amplification of the input signal, and it may be considered that the input signal is not amplified, that is, the gain is 0 dB, at this time, when the first switch is controlled to be turned on again, then the controllable attenuation circuit operates, and the input signal is attenuated, and the attenuation of the input signal may be realized by such control. In addition, different degrees of attenuation may also be realized by adjusting the first bias circuit and the second bias circuit so that the negative gain is continuously adjustable, and in some embodiments, the overall gain of the radio frequency power amplifier circuit after attenuation may be −5 dB, −7 dB, −10 dB, and so on. When the output power (which is relatively small) of the radio frequency power amplifier circuit is determined, the microprocessor may further obtain its input power and negative gain value, and the microprocessor adjusts the input power, controls the voltage signal Vgg, turns the first switch on, controls the second switch to be turned on, controls the internal current sources and internal voltage sources of the first and second bias circuits, and controls the drain power supply voltage Vcc, so as to increase the drain current and gate voltage of the bias circuit, so that the overall gain of the radio frequency power amplifier circuit meets the requirements.

The technical solutions provided by the embodiments of the disclosure have the following advantages: the variable attenuation circuit is designed at the input end of the signal, and the negative gain of the radio frequency power amplifier circuit is realized with minimal impact on the performance of the circuit in the non-negative gain mode, and the electrostatic protection of the input port is enhanced, the structure of the circuit is simple, the chip area occupied is small, and the hardware cost thereof may be effectively reduced.

The embodiments of the disclosure further provide a gain control method applied to the radio frequency power amplifier circuit of the above embodiments, including:

determining, by a microcontroller of the terminal, an operating mode of the radio frequency power amplifier circuit, after receiving a control information via a communication module, and controlling, by the microcontroller of the terminal, the radio frequency power amplifier circuit to enter the operating mode by transmitting a mode control signal;

switching, by the controllable attenuation circuit, between the negative gain mode and the non-negative gain mode of the radio frequency power amplifier circuit, based on a mode control signal transmitted by the microprocessor of the terminal;

matching, by the input matching circuit, the impedance between the controllable attenuation circuit and the drive amplification circuit;

amplifying, by the drive amplification circuit, the signal output from the input matching circuit;

adjusting, by the feedback circuit, the gain of the radio frequency power amplifier circuit;

matching, by the inter-stage matching circuit, the impedance between the drive amplification circuit and the power amplification circuit;

amplifying, by the power amplification circuit, the signal output from the inter-stage matching circuit;

matching, by the output matching circuit, the impedance between the radio frequency power amplifier circuit and the post-stage circuit.

Herein, the description of each of the circuits and specific gain control method may be found in the descriptions of the preceding embodiments and will not be described in detail here. It should be understood that references to 'an embodiment' or 'one embodiment' throughout the specification imply that a particular feature, structure or characteristic related to the embodiment is included in at least one embodiment of the disclosure. Therefore, the presence of 'in an embodiment' or 'in one embodiment' throughout the specification does not necessarily refer to the same embodiment. In addition, these particular features, structures or characteristics may be combined in one or more embodiments in any appropriate manner. It should be understood that in various embodiments of the disclosure, the serial numbers of the processes described above do not imply an sequence of execution, and the sequence of execution of the processes shall be determined by their functions and inherent logics and shall not limit the implementation of the embodiments of the disclosure in any way. The above-mentioned serial numbers of the embodiments of the disclosure are only for description, and do not represent what embodiments are advantageous or what embodiments are disadvantageous.

It should be noted that herein, the terms 'including', 'comprising' or any other variant thereof are intended to cover non-exclusive inclusion, so that a process, method, article or device including a series of elements includes not only those elements, but also other elements which are not explicitly listed, or further includes elements inherent to such process, method, article or device. Without further limitation, the element defined by the sentence "including one . . . " does not exclude the presence of other identical elements in such circuit in which the element is included.

The above descriptions are merely embodiments of the disclosure, but the protection scope of the disclosure is not limited thereto, and any technicians familiar with this technical field may readily conceive of variations or substitutions within the technical scope disclosed by the disclosure, and the variations or substitutions shall be covered by the protection scope of the disclosure. Therefore, the protection scope of the disclosure shall be subject to the protection scope of the claims.

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A radio frequency power amplifier circuit applied to a terminal, comprising:
    a controllable attenuation circuit, an input matching circuit, a drive amplification circuit, an inter-stage matching circuit, a power amplification circuit, and an output matching circuit connected in sequence; and
    a feedback circuit connected across the drive amplification circuit;
    wherein
    the controllable attenuation circuit is configured to switch between a negative gain mode and a non-negative gain mode of the radio frequency power amplifier circuit based on a mode control signal transmitted by a microprocessor of the terminal;
    the input matching circuit is configured to match the impedance between the controllable attenuation circuit and the drive amplification circuit;
    the drive amplification circuit is configured to amplify a signal output from the input matching circuit;
    the feedback circuit is configured to adjust a gain of the radio frequency power amplifier circuit;
    the inter-stage matching circuit is configured to match the impedance between the drive amplification circuit and the power amplification circuit;
    the power amplification circuit is configured to amplify a signal output from the inter-stage matching circuit; and
    the output matching circuit is configured to match the impedance between the radio frequency power amplifier circuit and a post-stage circuit.

2. The radio frequency power amplifier circuit of claim 1, wherein
    the mode control signal comprises a first control signal and a second control signal;
    the first control signal characterizes that when the radio frequency power amplifier circuit is switched to the non-negative gain mode, the controllable attenuation circuit is configured to control the controllable attenuation circuit itself in a non-attenuation state in response to the first control signal; and
    the second control signal characterizes that when the radio frequency power amplifier circuit is switched to the negative gain mode, the controllable attenuation circuit is configured to control the controllable attenuation circuit itself in an attenuation state in response to the second control signal.

3. The radio frequency power amplifier circuit of claim 2, wherein
    the controllable attenuation circuit comprises a first resistor, a second resistor, a first inductor and a first switch, a gate of the first switch is connected with a first end of the first resistor, a second end of the first resistor is connected with a first voltage signal, a drain of the first switch is connected with a first end of the second resistor, a source of the first switch is grounded, a first end of the first inductor is connected with an input signal, and a second end of the first inductor is connected with a second end of the second resistor;

the first switch is configured to turn the first switch itself off in response to the first control signal from the microprocessor, so as to allow the controllable attenuation circuit to be in the non-attenuation state so that the radio frequency power amplifier circuit is in the non-negative gain mode;

the first switch is also configured to turn the first switch itself on in response to the second control signal from the microprocessor, so as to allow the controllable attenuation circuit to be in the attenuation state so that the radio frequency power amplifier circuit is in the negative gain mode; and the first control signal is a first voltage signal with a first voltage value and the second control signal is the first voltage signal with a second voltage value, and the first voltage value is different from the second voltage value.

4. The radio frequency power amplifier circuit of claim 2, wherein the controllable attenuation circuit comprises a first resistor, a reserved resistor, a first inductor, a first switch and a reserved switch, wherein a gate of the first switch is connected with a first end of the first resistor;

a second end of the first resistor is connected with a first voltage signal;

a drain of the first switch is connected with a source of the reserved switch;

a source of the first switch is grounded;

a gate of the reserved switch is connected with a first end of the reserved resistor;

a second end of the reserved resistor is connected with the first voltage signal;

a drain of the reserved switch is connected with a first end of the first inductor;

a second end of the first inductor is connected with the input signal;

the first switch and the reserved switch are configured to turn the first switch and the reserved switch themselves off in response to the first control signal from the microprocessor, so as to allow the controllable attenuation circuit to be in the non-attenuation state so that the radio frequency power amplifier circuit is in the non-negative gain mode;

the first switch and the reserved switch are also configured to turn the first switch and the reserved switch themselves on in response to the second control signal from the microprocessor, so as to allow the controllable attenuation circuit to be in the attenuation state so that the radio frequency power amplifier circuit is in the negative gain mode; and the first control signal is a first voltage signal with a first voltage value and the second control signal is the first voltage signal with a second voltage value, and the first voltage value is different from the second voltage value.

5. The radio frequency power amplifier circuit of claim 1, further comprising:

a first bias circuit configured to increase a drain current and a gate voltage of the first bias circuit itself in response to a third control signal from the microprocessor, such that the radio frequency power amplifier circuit is in the non-negative gain mode; and the first bias circuit also configured to reduce the drain current and the gate voltage of the first bias circuit itself in response to a fourth control signal, such that the radio frequency power amplifier circuit is in the negative gain mode; wherein the first bias circuit is connected with the drive amplification circuit.

6. The radio frequency power amplifier circuit of claim 1, further comprising:

a second bias circuit configured to increase a drain current and a gate voltage of the second bias circuit itself in response to a fifth control signal from the microprocessor, so that the radio frequency power amplifier circuit is in the non-negative gain mode; and the second bias circuit also configured to reduce the drain current and the gate voltage of the second bias circuit itself in response to a sixth control signal, so that the radio frequency power amplifier circuit is in the negative gain mode;

wherein the second bias circuit is connected with the power amplification circuit.

7. The radio frequency power amplifier circuit of claim 3, wherein the drive amplification circuit comprises a second capacitor, a second metal-oxide-semiconductor (MOS) field-effect transistor (MOS transistor) and a third MOS transistor, and a gate of the second MOS transistor is connected with a second end of a third resistor, a drain of the second MOS transistor is connected with a source of the third MOS transistor, a source of the second MOS transistor is grounded, and a first end of the second capacitor is connected with a gate of the third MOS transistor, and a second end of the second capacitor is grounded.

8. The radio frequency power amplifier circuit of claim 7, wherein the feedback circuit comprises a third capacitor, a fourth capacitor, a fifth capacitor, a sixth capacitor, a fourth resistor, a fifth resistor, and a second switch, a first end of the fourth capacitor and a first end of the sixth capacitor are connected with a drain of the third MOS transistor, a second end of the fourth capacitor is connected with a first end of the fourth resistor, a second end of the fourth resistor is connected with a first end of the third capacitor, a second end of the sixth capacitor is connected with a first end of the second switch, a second end of the second switch is connected with a first end of the fifth resistor, a second end of the fifth resistor is connected with a first end of the fifth capacitor, a second end of the fifth capacitor and a second end of the third capacitor are connected with a second end of a second inductor; wherein the second switch is configured to turn the second switch itself off in response to a seventh control signal from the microprocessor, so as to reduce a feedback depth so that the radio frequency power amplifier circuit is in the non-negative gain mode; and the second switch is also configured to turn the second switch itself on in response to an eighth control signal to increase the feedback depth so that the radio frequency power amplifier circuit is in the negative gain mode.

9. The radio frequency power amplifier circuit of claim 3, wherein the first switch is a silicon on insulator CMOS transistor, or a planar structured MOS transistor.

10. A gain control method applied to the radio frequency power amplifier circuit of claim 9, comprising:
- determining, by a microcontroller of the terminal, an operating mode of the radio frequency power amplifier circuit, after receiving a control information via a communication module, and controlling, by the microcontroller of the terminal, the radio frequency power amplifier circuit to enter the operating mode by transmitting a mode control signal;
- switching, by the controllable attenuation circuit, between the negative gain mode and the non-negative gain mode of the radio frequency power amplifier circuit, based on a mode control signal transmitted by the microprocessor of the terminal;
- matching, by the input matching circuit, the impedance between the controllable attenuation circuit and the drive amplification circuit;
- amplifying, by the drive amplification circuit, the signal output from the input matching circuit;
- adjusting, by the feedback circuit, the gain of the radio frequency power amplifier circuit;
- matching, by the inter-stage matching circuit, the impedance between the drive amplification circuit and the power amplification circuit;
- amplifying, by the power amplification circuit, the signal output from the inter-stage matching circuit; and
- matching, by the output matching circuit, the impedance between the radio frequency power amplifier circuit and the post-stage circuit.

11. A Narrow Band Internet of Things (NB-IoT) terminal device comprising the radio frequency power amplifier circuit of claim 1, wherein the controllable attenuation circuit is disposed a signal input end of the device, and wherein the negative gain of the power amplifier gain is realized while providing Electro-Static Discharge (ESD) protection to the signal input end.

12. The device of claim 11, wherein
the mode control signal comprises a first control signal and a second control signal;
the first control signal characterizes that when the radio frequency power amplifier circuit is switched to the non-negative gain mode, the controllable attenuation circuit is configured to control the controllable attenuation circuit itself in a non-attenuation state in response to the first control signal; and
the second control signal characterizes that when the radio frequency power amplifier circuit is switched to the negative gain mode, the controllable attenuation circuit is configured to control the controllable attenuation circuit itself in an attenuation state in response to the second control signal.

13. The device of claim 12, wherein
the controllable attenuation circuit comprises a first resistor, a second resistor, a first inductor and a first switch, a gate of the first switch is connected with a first end of the first resistor, a second end of the first resistor is connected with a first voltage signal, a drain of the first switch is connected with a first end of the second resistor, a source of the first switch is grounded, a first end of the first inductor is connected with an input signal, and a second end of the first inductor is connected with a second end of the second resistor;
the first switch is configured to turn the first switch itself off in response to the first control signal from the microprocessor, so as to allow the controllable attenuation circuit to be in the non-attenuation state so that the radio frequency power amplifier circuit is in the non-negative gain mode;
the first switch is also configured to turn the first switch itself on in response to the second control signal from the microprocessor, so as to allow the controllable attenuation circuit to be in the attenuation state so that the radio frequency power amplifier circuit is in the negative gain mode; and
the first control signal is a first voltage signal with a first voltage value and the second control signal is the first voltage signal with a second voltage value, and the first voltage value is different from the second voltage value.

14. The device of claim 12, wherein
the controllable attenuation circuit comprises a first resistor, a reserved resistor, a first inductor, a first switch and a reserved switch,
wherein
a gate of the first switch is connected with a first end of the first resistor;
a second end of the first resistor is connected with a first voltage signal;
a drain of the first switch is connected with a source of the reserved switch;
a source of the first switch is grounded;
a gate of the reserved switch is connected with a first end of the reserved resistor;
a second end of the reserved resistor is connected with the first voltage signal;
a drain of the reserved switch is connected with a first end of the first inductor;
a second end of the first inductor is connected with the input signal;
the first switch and the reserved switch are configured to turn the first switch and the reserved switch themselves off in response to the first control signal from the microprocessor, so as to allow the controllable attenuation circuit to be in the non-attenuation state so that the radio frequency power amplifier circuit is in the non-negative gain mode;
the first switch and the reserved switch are also configured to turn the first switch and the reserved switch themselves on in response to the second control signal from the microprocessor, so as to allow the controllable attenuation circuit to be in the attenuation state so that the radio frequency power amplifier circuit is in the negative gain mode; and
the first control signal is a first voltage signal with a first voltage value and the second control signal is the first voltage signal with a second voltage value, and the first voltage value is different from the second voltage value.

15. The device of claim 11, further comprising:
a first bias circuit configured to increase a drain current and a gate voltage of the first bias circuit itself in response to a third control signal from the microprocessor, such that the radio frequency power amplifier circuit is in the non-negative gain mode; and
the first bias circuit also configured to reduce the drain current and the gate voltage of the first bias circuit itself in response to a fourth control signal, such that the radio frequency power amplifier circuit is in the negative gain mode; wherein the first bias circuit is connected with the drive amplification circuit.

16. The device of claim 11, further comprising:

a second bias circuit configured to increase a drain current and a gate voltage of the second bias circuit itself in response to a fifth control signal from the microprocessor, so that the radio frequency power amplifier circuit is in the non-negative gain mode; and the second bias circuit also configured to reduce the drain current and the gate voltage of the second bias circuit itself in response to a sixth control signal, so that the radio frequency power amplifier circuit is in the negative gain mode;

wherein the second bias circuit is connected with the power amplification circuit.

17. The device of claim 13, wherein the drive amplification circuit comprises a second capacitor, a second metal-oxide-semiconductor (MOS) field-effect transistor (MOS transistor) and a third MOS transistor, and a gate of the second MOS transistor is connected with a second end of a third resistor, a drain of the second MOS transistor is connected with a source of the third MOS transistor, a source of the second MOS transistor is grounded, and a first end of the second capacitor is connected with a gate of the third MOS transistor, and a second end of the second capacitor is grounded.

18. The device of claim 17, wherein the feedback circuit comprises a third capacitor, a fourth capacitor, a fifth capacitor, a sixth capacitor, a fourth resistor, a fifth resistor, and a second switch, a first end of the fourth capacitor and a first end of the sixth capacitor are connected with a drain of the third MOS transistor, a second end of the fourth capacitor is connected with a first end of the fourth resistor, a second end of the fourth resistor is connected with a first end of the third capacitor, a second end of the sixth capacitor is connected with a first end of the second switch, a second end of the second switch is connected with a first end of the fifth resistor, a second end of the fifth resistor is connected with a first end of the fifth capacitor, a second end of the fifth capacitor and a second end of the third capacitor are connected with a second end of a second inductor; wherein the second switch is configured to turn the second switch itself off in response to a seventh control signal from the microprocessor, so as to reduce a feedback depth so that the radio frequency power amplifier circuit is in the non-negative gain mode; and the second switch is also configured to turn the second switch itself on in response to an eighth control signal to increase the feedback depth so that the radio frequency power amplifier circuit is in the negative gain mode.

19. The device of claim 13, wherein the first switch is a silicon on insulator CMOS transistor, or a planar structured MOS transistor.

* * * * *